United States Patent [19]

Brovost et al.

[11] Patent Number: 4,959,611
[45] Date of Patent: Sep. 25, 1990

[54] OUT-OF-SLICE ARTIFACT REDUCTION TECHNIQUE FOR MAGNETIC RESONANCE IMAGERS

[75] Inventors: Terrence J. Brovost, Cleveland Hts.; David A. Lampman, Lakewood; Kenneth S. Foster, Eastlake, all of Ohio

[73] Assignee: Picker International, Inc., Highland Hts., Ohio

[21] Appl. No.: 373,344

[22] Filed: Jun. 29, 1989

[51] Int. Cl.⁵ ............................................. G01R 33/20
[52] U.S. Cl. ..................................... 324/309; 324/307
[58] Field of Search ............... 324/300, 307, 309, 310, 324/311, 312, 313, 318, 322; 128/653

[56] References Cited

U.S. PATENT DOCUMENTS

| | | | |
|---|---|---|---|
| 4,484,138 | 11/1984 | Bottomley et al. | 324/307 |
| 4,706,026 | 11/1987 | Pelc et al. | 324/309 |
| 4,777,438 | 10/1988 | Holland | 324/309 |
| 4,870,361 | 9/1989 | Kleef et al. | 324/309 |

Primary Examiner—Michael J. Tokar
Attorney, Agent, or Firm—Fay, Sharpe, Beall, Fagan, Minnich & McKee

[57] ABSTRACT

In-slice magnetic resonance is excited with a 90° RF pulse (50, 50'). A 180° RF pulse (56, 56') is applied to cause a magnetic resonance spin echo (58, 58'). However, the 180° pulse also induces resonance in material outside the selected slice. The out-of-slice data is superimposed on the magnetic resonance spin echoes. Two views of magnetic resonance data are collected with the same phase encode gradient and stored temporarily in first and second memories (72, 74). The views are combined (76) such that the out-of-slice data sums and the in-slice data cancels. The magnitude of the out-of-slice data is magnitude adjusted (78) to create an out-of-slice magnetization view which is stored in an out-of-slice magnetization memory (80). A plurality of views with different phase encode gradients are subsequently collected during a magnetic resonant imaging sequence. Each view is subtracted from (90) the out-of-slice data view and transformed (92) into an image representation.

13 Claims, 3 Drawing Sheets

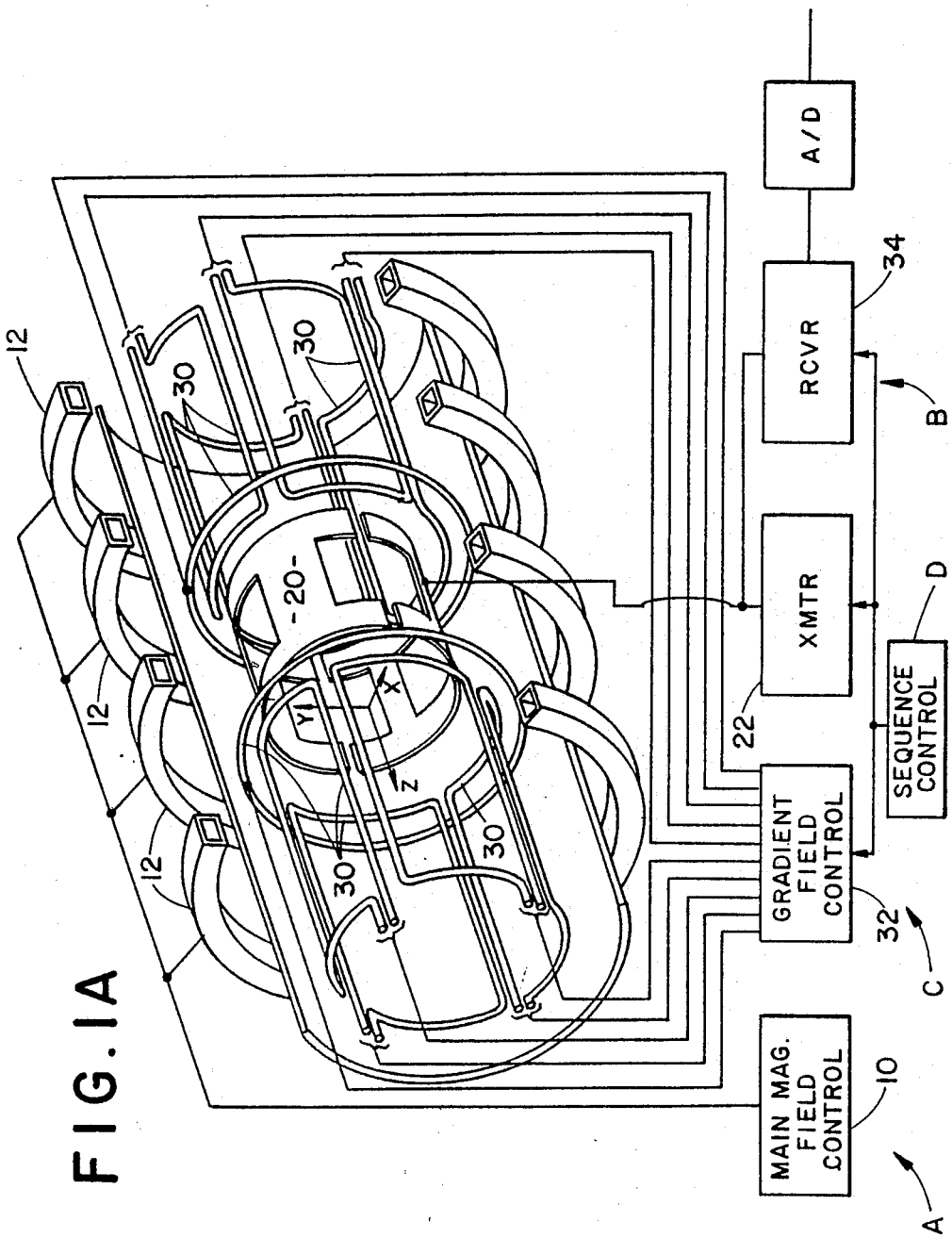

OUT-OF-SLICE ARTIFACT REDUCTION TECHNIQUE FOR MAGNETIC RESONANCE IMAGERS

BACKGROUND OF THE INVENTION

The present invention relates to the field of magnetic resonance artifact correction. It finds particular application in the removal of out-of-slice artifacts in magnetic resonance imaging. It will be described with particular reference thereto.

In spin echo imaging, magnetic resonance is excited with a 90° radio frequency pulse. A 180° RF pulse is applied to cause a subsequent spin echo. The resonance is phase encoded by the application of a phase encoded gradient, either before or after the 180° pulse. Magnetic resonance signals from the echo are collected to form a corresponding view. This sequence is repeated with each of a plurality of phase encode gradient steps to create a plurality of views each with corresponding phase encoding. Commonly, the phase is alternated for adjacent views such that the views have alternating polarity to remove DC offset errors.

Imperfections in the 180° radio frequency pulses create out-of-slice magnetization, particularly in non-averaged spin echo pulse sequences, i.e. sequences in which only one echo signal or view is generated with each phase encoding. This out-of-slice magnetization is not refocused into the echo but its residual signals may occur during data sampling, resulting in artifacted images.

Heretofore, additional gradients have been added to the sequence for dephasing or blurring the out-of-slice magnetization. In addition, phase alternation will shift the out-of-slice artifacts to the edge of the field of view. These correction techniques have several drawbacks. First, the dephasing gradient pulses require a substantial amount of electrical energy. The amount of energy required increases for the higher spatial frequency components which represent edges in the image. Second, the imaging sequence must be lengthened to accommodate the additional dephasing gradients. Third, the minimum field of view must be enlarged. The out-of-slice artifacts that are shifted to the edge of the field of view must be displaced from the edge of the diagnostic image a sufficient distance so as not to interfere. At times this requires generating a larger image than is diagnostically required.

The present invention provides a new and improved magnetic resonance technique which overcomes the above referenced problems and others.

SUMMARY OF THE INVENTION

In accordance with one aspect of the present invention, the method of magnetic resonance imaging is provided. A magnetic resonance view is created which carries only data attributable to out-of-slice artifacts. Thereafter, a plurality of views are measured with different phase encodings. The out-of-slice artifact view is subtracted from the phase encoded views to produce out-of-slice corrected phase encoded views which are transformed into an image representation.

In accordance with a more limited aspect of the present invention, the step of creating the out-of-slice artifact view is performed by repeating a sequence twice, but with the phase alternated. For example, the first time the sequence may include a first polarity 90° Rf pulse followed by the phase encode gradient and a refocussing pulse to produce a first spin echo. The second time, the 90° RF pulse is of opposite polarity and the phase encode and refocussing pulses are of the same polarity as in the first sequence. This produces two views, both views have like image data but with the opposite polarity and like out-of-slice artifact data with the same polarity. The out-of-slice artifact view is produced by adding these views and dividing by two.

In accordance with another aspect of the present invention, a magnetic resonance imaging apparatus is provided. The apparatus includes a means for performing each of the above described steps.

One advantage of the present invention resides in the reduced gradient power requirements.

Another advantage of the present invention is that its sequence time may be reduced. Analogously, the minimum echo times can also be reduced.

Yet other advantages of the present invention include an improvement in the signal-to-noise ratio, a reduction in the effects of diffusion, and increased slice throughput.

BRIEF DESCRIPTION OF THE DRAWINGS

The invention may take form in various steps and arrangement of steps and in various components and arrangements of components. The drawings are only for purposes of illustrating a preferred embodiment and are not to be construed as limiting of the invention.

FIGS. 1A and 1B taken together are a diagrammatic illustration of a magnetic resonance apparatus incorporating the present invention.

DETAILED DESCRIPTION OF THE PREFERRED EMBODIMENT

Figure 1B:
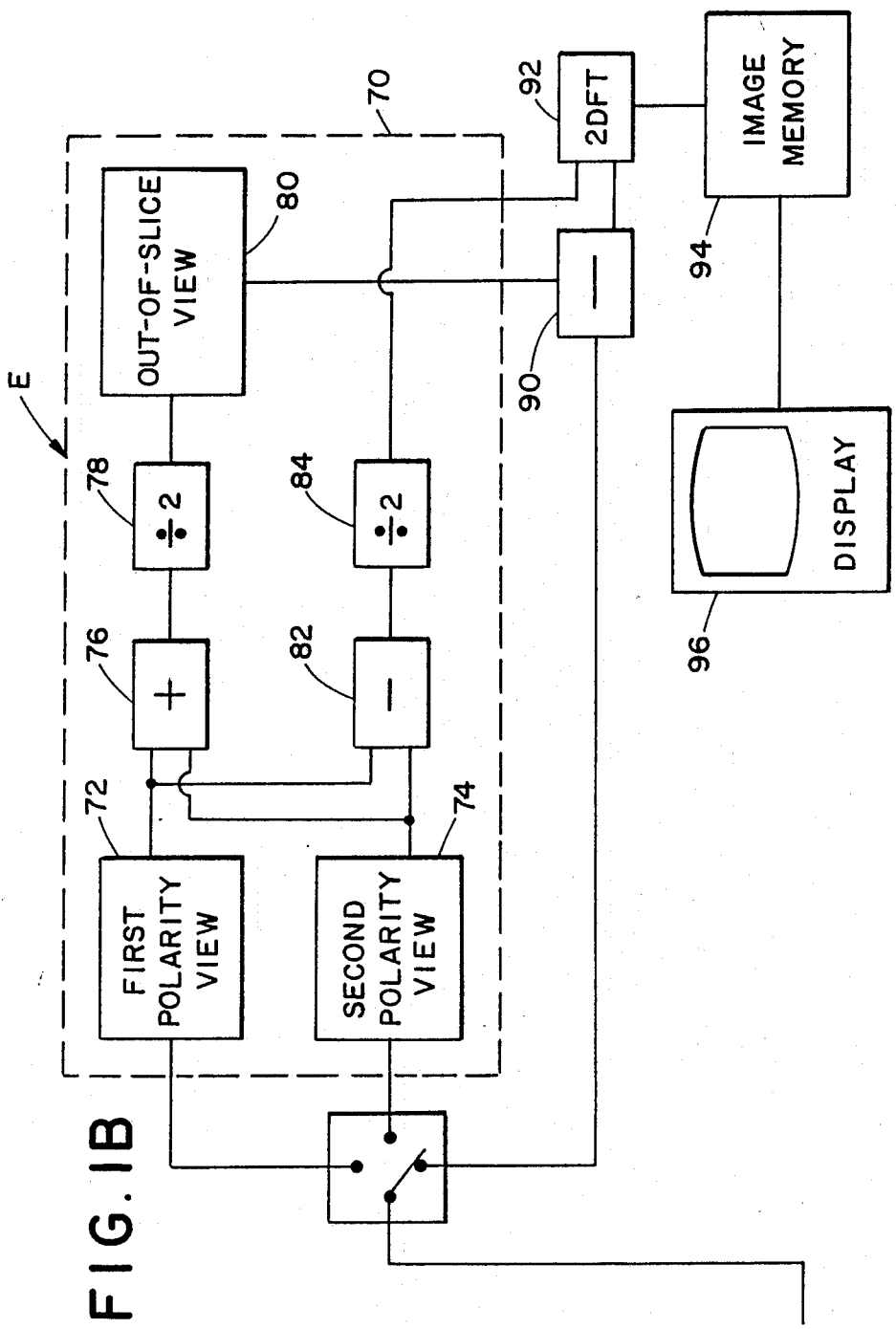

With reference to FIGS. 1A and 1B, a magnetic resonance imaging apparatus includes a main magnetic field means A for generating a substantially uniform magnetic field through an examination region. A radio frequency means B selectively transmits radio frequency excitation pulses for exciting selected dipoles within the region to resonance. The radio frequency means also provides radio frequency pulses for selectively rotating or otherwise manipulating the selected components of the magnetization, e.g., selective 90° pulses, 180° pulses, or the like. A gradient field means C selectively applies gradient fields, preferably along three orthogonal axes across the examination region. A pulse sequence control means D controls the radio frequency means and the gradient means to cause the generation of preselected pulse sequences, such as a sequence of FIG. 2. An image means E processes received magnetic resonance signals or views and reconstructs an electronic image representation for archiving, display on a video monitor, or the like.

The magnetic field means A includes a control circuit to and a plurality of superconducting or resistive coils 12 for generating the magnetic field. The control circuit causes the magnets to generate a substantially uniform magnetic field axially therethrough, particularly in a centrally located examination or image region 14. Magnetic field shimming devices (not shown), as are conventional in the art, may be provided for improving the uniformity of the magnetic field.

The radio frequency means B includes a radio frequency coil 20, such as a quadrature coil which surrounds the examination region. A radio frequency transmitter 22 selectively applies radio frequency pulses to the RF coil 20 to excite and manipulate magnetic resonance of the magnetization of selected dipoles in the examination region. The radio frequency transmitter shapes the radio frequency pulses, as is known in the art, to compensate for physical constraints of the system in order to optimize the magnetic resonance images.

The gradient field means C includes gradient coils 30 for causing gradients across the main magnetic field in the examination region at selectable angles. A gradient field control means 32 applies current pulses to the gradient coils 30 to cause gradients along three orthogonal axes, designated in FIG. 2 as a slice select, read, and phase encode axes or directions. The gradient field control means may adjust the shape of the current pulses to compensate for eddy currents or other system constraints as are known in the art.

The radio frequency means B also includes a radio frequency receiver 34 that receives magnetic resonance signals at least during an induced magnetic resonance echo. The magnetic resonance signal or view from the receiver is digitized by an analog-to-digital converter to produce a digital data line or view. A view memory or latch means temporarily stores or holds each data view.

Figure 2:
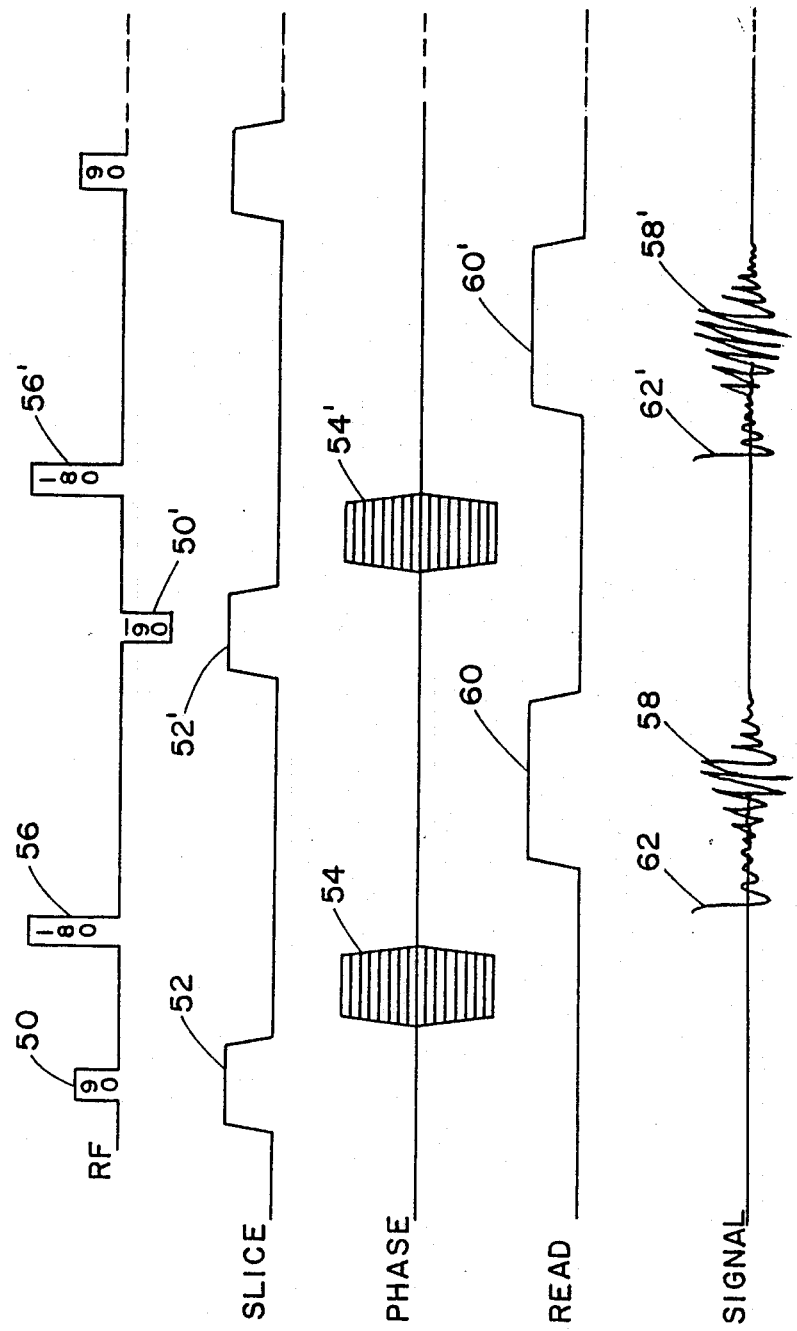
FIG. 2 is a diagrammatic illustration of an exemplary radio frequency and gradient pulse sequence with which the presence invention can be implemented.

With reference to FIG. 2, the pulse sequence control means D controls the radio frequency transmitter 22 and the gradient field control means 32 to create a spin echo pulse sequence. An RF pulse 50 is applied concurrently with a slice select gradient 52. A phase encode gradient 54 having one of a preselected plurality of phase encoded gradient steps is applied to phase encode the excited resonance. Conventionally, the phase encode gradient varies incremently in steps between a negative maximum phase encode gradient through zero to a symmetric positive maximum phase encode gradient. In each repetition of the sequence, the phase encode gradient is applied with one of these preselected steps. The radio frequency transmitter causes a 180° RF pulse 56, to be applied to refocus the magnetization such that a magnetic resonance echo 58 occurs. A read gradient 60 is applied concurrently with the echo 58. Imperfections in the 180° RF pulse cause it to excite resonance in dipoles outside of the selected slice, i.e. it creates transverse magnetization in those regions where it is not a perfect 180° pulse. As illustrated in the "signal" line of FIG. 2, an out-of-slice signal 62 immediately follows each 180° pulse.

In the next repetition of the sequence, the analogous RF pulses and gradient pulses are applied. The phase of the excitation pulse is alternated or reversed. That is, an 90° pulse 50' is applied concurrently with a slice select pulse 52'. A second gradient pulse 54' is followed by a second 180° refocusing pulse 56'. A second read gradient 60' is applied concurrently with a second echo 58' and the trailing end of the out-of-slice signal 62'.

The term "in-slice" is used to refer to the region in which resonance is intended to be excited, regardless of whether the region is a slice, slab, volume, or the like. The term "out-of-slice" refers to resonance from out side of the "in-slice" region.

Changing the polarity of the 90° RF excitation pulses changes the polarity or reverses the phase of the in-slice component but has no effect on the out-of-slice component polarity. Accordingly, the in-slice component and the out-of-slice component have the same polarity in one echo and the opposite polarity in the other. Alternately, the 90° RF pulses can have the same phase and the 180° RF pulses can be phase alternated. When the 90° pulses are phase alternated, the polarity of the in-slice data reverses and the out-of-slice stays the same. When the 180° pulses are phase alternated, the polarity of the in-slice data stays the same and the polarity of the out-of-slice is reversed. The result of phase alternation of the 90° pulse from one view to the next is that the out-of-slice signal is thrown out to the edge of the field of view in the phase encoding direction. However, the drawback is that the artifact is still present—it has just been moved to the edge of the field of view. In some cases, the edge of the field of view may be of interest and this artifact will obscure it. Another problem occurs with offsetting in the phase encode direction which rebins the edge of the field of view toward the center by the distance the field of view is offset.

Referring again to FIGURE 1, an out-of-slice artifact magnetic resonance view determining means 70 measures or derives a magnetic resonance view containing data which is attributable to the out-of-slice resonance. The above described magnetic resonance sequence is performed as described above with the same phase encode gradient in two phase alternated repetitions. The sequence is performed with a positive 90° excitation pulse followed by the largest or highest frequency phase encode gradient and again with a minus 90° excitation pulse followed by the same phase encode gradient. This minimizes the effect of RF carrier feedthrough which is most prevalent around the zero phase encoding view. A first polarity view memory or latch 72 stores the first view with the maximum or other selected phase encoded gradient. A second polarity memory or latch means 74 stores the phase alternated view. Again, the spin echo data has the opposite polarity in these two views and the out-of-slice artifacts have the same polarity. An adding means 76 combines these two views which adds or doubles the out-of-slice artifacts and subtracts or removes the in-slice data. A dividing or amplitude adjusting means 78 divides the resultant view by two to produce an amplitude adjusted out-of-slice artifact view which is stored in an out-of-slice artifact view memory 80. Of course, a larger number of views may be averaged to determine the out-of-slice artifact view.

To optimize data collection efficiency, a subtracting means 82 combines the phase alternated views from memories 72 and 74 in such a manner that the image data doubles and the out-of-slice data cancels. A dividing means 84 divides this data by two for magnitude conformity with subsequently collected views.

Once the out-of-slice artifact view has been determined, the sequence of FIG. 2 is repeated to generate one view for each of the phase encode gradients. These views are directed to a combining means which combines the out-of-slice artifact view with each subsequent view in a manner which subtracts or cancels the out-of-slice artifact data from each subsequent view. Preferably, the subsequent views are phased alternated such that the polarity of the image data alternates. However, as discussed above, the polarity of the out-of-slice remains the same. Thus, the same subtractive combination can be performed on each.

When the phase encoding gradient is applied prior to the 180° RF pulse, out-of-slice free induction decay signal caused by the 180° RF pulse is not phase encoded. Thus, the out-of-slice artifact data does not change phase from view-to-view even as the views are phase alternated. Thus, a single measurement of the out-of-slice artifact data may be utilized to correct an entire data set.

The views are conveyed to a two dimensional Fourier transform means 92 which transforms the view data into an image representation. The image representation is stored in an image memory 94 for display on a video monitor 96, archiving tape or disc, further processing, or the like.

Other embodiments are also envisioned. For example, alternating the transmitter phase without alternating the receiver phase which generates two views which are added or subtracted to produce the out-of-slice artifact view or said echo view. As another embodiment, the transmitting and receiving polarity can be inverted for one phase encoding view. When the two data acquisitions are subtracted, one is left only with the contribution from out-of-slice signal. This again gives an estimate of twice the amplitude of the out-of-slice magnetization or artifact data. Other embodiments may call for acquiring data from only a restricted part of the alternately phase encoded view in order to eliminate spurious signals. As yet another alternative, the out-of-slice signal may be determined with a reduced attenuation setting and suitable multiplication factor. The out-of-slice magnetization can also be estimated from a sequence in which the standard excitation pulse has been multiplied by zero and the refocusing pulse has not.

The invention has been described with reference to the preferred embodiment. Obviously, modifications and alterations will occur to others upon reading and understanding the preceding detailed description. It is intended that the invention be construed as including all such alterations and modifications insofar as they come within the scope of the appended claims or the equivalents thereof.

Having thus described the preferred embodiment, the invention is now claimed to be:

1. A method of magnetic resonance imaging comprising:
    measuring a magnetic resonance view attributable to out-of-slice magnetization;
    measuring a plurality of views with different phase encodings;
    subtracting the out-of-slice magnetization view from each of the phase encoded views to produce out-of-slice corrected phase encoded views; and,
    transforming the out-of-slice corrected phase encoded views into an image representation.

2. The method as set forth in claim 1 wherein the step of measuring out-of-slice magnetization includes:
    repeating a spin echo imaging sequence twice for the same phase encoding but with the phase alternated such that two views are generated, each view having out-of-slice artifacts and in-slice signals;
    combining the two views such that the out-of-slice artifacts add and the in-slice signals subtract.

3. The method as set forth in claim 1 wherein the step of measuring the out-of-slice magnetization view includes:
    repeating a spin echo sequence twice for the same phase encode gradient such that two views are generated which have in-slice data of the same polarity and out-of-slice of an opposite polarity;
    subtracting the two views to obtain the out-of-slice magnetization.

4. The method as set forth in claim 1 wherein the step of measuring the out-of-slice magnetization includes:
    applying a first 90° radio frequency pulse of a first polarity concurrently with a slice select gradient;
    applying a first phase encode gradient;
    applying a radio frequency refocussing pulse;
    applying a read gradient concurrently with a resultant first magnetic resonance echo;
    converting the first magnetic resonance echo into a first view;
    applying a second 90 radio frequency pulse with a second polarity concurrently with the slice select gradient;
    applying the first phase encode gradient;
    applying the radio frequency refocussing pulse;
    applying the read gradient concurrently with a resultant second magnetic resonance echo; and
    converting the second magnetic resonance echo into a second view; and,
    combining the first and second views such that out-of-slice magnetization introduced by the radio frequency refocussing pulse is summed and the echo cancels to obtain the out-of-slice magnetization views.

5. A method of magnetic resonance comprising:
    (a) exciting magnetic resonance in a selected region of an object;
    (b) phase encoding of the induced resonance;
    (c) refocussing the resonance to cause a spin echo;
    (d) monitoring the resonance during the echo to generate a view of magnetic resonance data, the view including magnetic resonance data attributable to the magnetic resonance from the selected region and out-of-region data attributable to the magnetization outside of the region;
    (e) repeating steps (a)-(d) with each of a plurality of phase encodings;
    (f) removing the out-of-region magnetization data from each view;
    (g) reconstructing an image representation from the out-of-region magnetization removed views.

6. The method as set forth in claim 5 further including deriving the out-of-region magnetization data to be subtracted from each view.

7. The method as set forth in claim 6 wherein the deriving step includes:
    generating a first view in which the in-region and out-of-region magnetization data have the same polarity;
    generating a second view in which the in-region and out- of-region data have opposite polarity;
    combining the first and second views so as to sum the out-of-region data and cancel the in-region data.

8. The magnetic resonance imaging apparatus comprising:
    a means for exciting magnetic resonance in an examination region;
    a means for phase encoding the excited resonance;
    a receiving means for receiving a magnetic resonance echo and producing a view indicative of magnetization received during the echo, the received magnetization including an in-slice component and an out-of-slice magnetization component;
    a combining means for combining each view with an out-of-slice magnetization view;
    a transforming means for transforming views into an image representation, the transforming means being operatively connected with the combining means for receiving views therefrom.

9. The apparatus as set forth in claim 8 further including an out-of-slice magnetization view memory means for storing the out-of-slice magnetization view, the out-of-slice magnetization memory means being operatively connected with the combining means.

10. The apparatus as set forth in claim 9 further including means for deriving the out-of-slice magnetization view.

11. The apparatus as set forth in claim 10 wherein the out-of-slice magnetization view deriving means includes:
   a first memory means for receiving a view encoded with a first phase encode gradient in which the in-slice and out- of-slice data have the same polarity; and
   a second memory means for storing a second view encoded with the first phase encoding in which the in-slice and out- of-slice data have opposite polarity; and
   a second combining means for combining the views in the first and second memory means such that the out-of-slice magnetization is summed and the in-slice magnetization cancels.

12. The apparatus as set forth in claim 11 further including amplitude adjusting means for selectively adjusting the amplitude of the combined out-of-slice magnetization data, the amplitude correcting means being operatively connected with the out-of-slice resonance memory means for conveying the amplitude adjusted out-of-slice magnetization view thereto.

13. The apparatus as set forth in claim 12 further including:
   a third combining means for combining the views in the first and second memory means such that the in-slice data is summed and the out-of-slice data cancels; and
   an amplitude adjusting means for adjusting the amplitude of the view from the third combining means and supplying it to the transform means.

* * * * *

UNITED STATES PATENT AND TRADEMARK OFFICE
CERTIFICATE OF CORRECTION

PATENT NO. : 4,959,611
DATED : September 25, 1990
INVENTOR(S) : Provost, et al.

It is certified that error appears in the above-identified patent and that said Letters Patent is hereby corrected as shown below:

On the title page, in the heading, the inventor's name should read --Provost, et al.-- and in section [75] the first inventor's name should read --Terrence J. Provost--.

Signed and Sealed this

Seventeenth Day of March, 1992

Attest:

HARRY F. MANBECK, JR.

*Attesting Officer*   *Commissioner of Patents and Trademarks*